(12) United States Patent
Tseng et al.

(10) Patent No.: US 10,684,314 B2
(45) Date of Patent: Jun. 16, 2020

(54) SYSTEM AND METHOD FOR TESTING REFERENCE VOLTAGE CIRCUIT

(71) Applicant: NUVOTON TECHNOLOGY CORPORATION, Hsinchu (TW)

(72) Inventors: Te-Ming Tseng, Hsinchu (TW); Yeh-Tai Hung, Hsinchu (TW); Wen-Yi Li, Hsin-chu (TW)

(73) Assignee: Nuvoton Technology Corporation, Hsinchu (TW)

( * ) Notice: Subject to any disclaimer, the term of this patent is extended or adjusted under 35 U.S.C. 154(b) by 203 days.

(21) Appl. No.: 16/004,166

(22) Filed: Jun. 8, 2018

(65) Prior Publication Data

US 2019/0041433 A1 Feb. 7, 2019

(30) Foreign Application Priority Data

Aug. 3, 2017 (TW) .............................. 106126257 A

(51) Int. Cl.
*G01R 19/10* (2006.01)
*H03K 5/24* (2006.01)
*G05F 1/625* (2006.01)
*G01R 19/165* (2006.01)

(52) U.S. Cl.
CPC ............ *G01R 19/10* (2013.01); *H03K 5/24* (2013.01); *G01R 19/16552* (2013.01); *G05F 1/625* (2013.01)

(58) Field of Classification Search
CPC ............ G01R 19/10; G01R 19/16552; G01R 31/2834; G01R 31/327; G05F 1/625; H03K 5/24

USPC ............................................. 324/140 R, 713
See application file for complete search history.

(56) References Cited

U.S. PATENT DOCUMENTS

| | | | | |
|---|---|---|---|---|
| 5,994,927 A * | 11/1999 | Naito | ...................... | H03K 5/153 327/72 |
| 7,272,523 B1 * | 9/2007 | John | ...................... | H01L 22/14 257/E21.525 |
| 8,138,764 B2 * | 3/2012 | Luzzi | ...................... | G05F 3/30 323/313 |
| 8,648,648 B2 * | 2/2014 | Choi | ...................... | G05F 3/30 323/313 |
| 9,081,038 B2 * | 7/2015 | Spalding, Jr. | .......... | G01R 15/06 |
| 9,203,390 B1 * | 12/2015 | Lee | ...................... | H03K 5/24 |
| 9,557,354 B2 * | 1/2017 | Chen | ...................... | H03K 5/24 |
| 9,979,383 B2 * | 5/2018 | Krishna | ................... | H03K 5/24 |
| 9,989,984 B2 * | 6/2018 | Tseng | ...................... | G05F 3/24 |

(Continued)

FOREIGN PATENT DOCUMENTS

| | | | |
|---|---|---|---|
| CN | 106959724 A * | 7/2017 | |
| JP | 2017126339 A * | 7/2017 | ............... G05F 3/24 |

(Continued)

*Primary Examiner* — Patrick Assouad
*Assistant Examiner* — Sean Curtis
(74) *Attorney, Agent, or Firm* — Muncy, Geissler, Olds & Lowe, P.C.

(57) ABSTRACT

Provided is a system for testing a reference voltage circuit applicable to a reference voltage circuit. The reference voltage circuit includes a bandgap reference voltage circuit, switching elements, a first capacitor, a second capacitor and a comparator. The testing system includes a control logic unit. In a test mode, the control logic unit adjusts an allowable value of the comparator to speed up the suitability test of the switching elements.

15 Claims, 9 Drawing Sheets

(56) References Cited

U.S. PATENT DOCUMENTS

| | | | |
|---|---|---|---|
| 10,401,399 B2 * | 9/2019 | Chen | H03K 17/223 |
| 10,473,698 B2 * | 11/2019 | Dahl | G01R 19/16538 |
| 10,491,204 B1 * | 11/2019 | Hunter | H03K 5/24 |
| 2007/0132486 A1 * | 6/2007 | O'Keefe | G06F 1/28 |
| | | | 327/77 |
| 2009/0121701 A1 * | 5/2009 | Kim | G05F 3/30 |
| | | | 323/313 |
| 2011/0001555 A1 * | 1/2011 | Luzzi | G05F 3/30 |
| | | | 327/539 |
| 2013/0193981 A1 * | 8/2013 | Chen | H03K 5/24 |
| | | | 324/537 |
| 2014/0176250 A1 * | 6/2014 | Thomsen | H03K 3/0231 |
| | | | 331/143 |
| 2014/0361917 A1 * | 12/2014 | Matsuno | G01R 19/0038 |
| | | | 341/155 |
| 2017/0199540 A1 * | 7/2017 | Tseng | G05F 3/24 |
| 2018/0328966 A1 * | 11/2018 | Dahl | G01R 19/16519 |
| 2019/0041433 A1 * | 2/2019 | Tseng | G01R 19/10 |
| 2019/0072588 A1 * | 3/2019 | Chen | G01R 19/155 |

FOREIGN PATENT DOCUMENTS

| | | | |
|---|---|---|---|
| KR | 20170084695 A | * | 7/2017 |
| TW | I557529 B | * | 11/2016 |
| TW | 201725465 A | * | 7/2017 |

\* cited by examiner

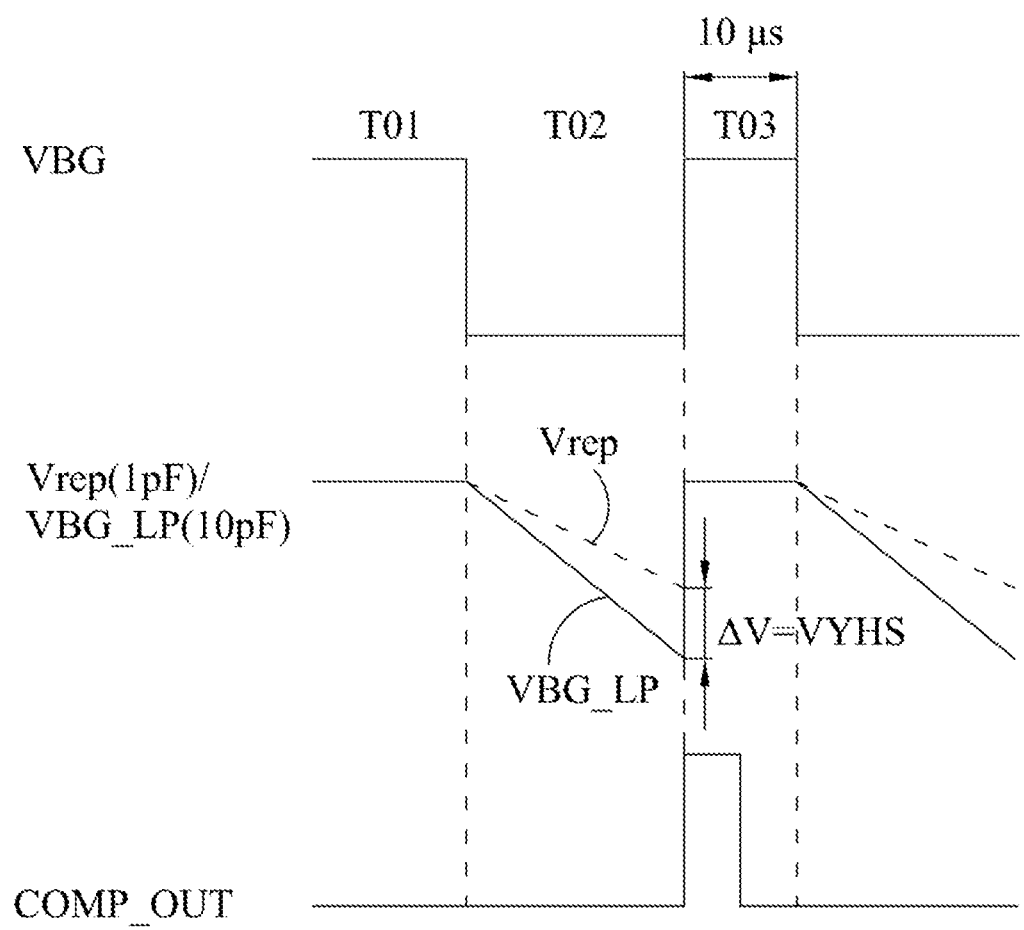

SYSTEM AND METHOD FOR TESTING REFERENCE VOLTAGE CIRCUIT

CROSS-REFERENCE TO RELATED APPLICATION

This application claims priority to and the benefit of Taiwan Patent Application No. 106126257, filed on Aug. 3, 2017, at the Taiwan Intellectual Property Office, the entire contents of which are herein incorporated by reference in their entirety.

BACKGROUND OF THE INVENTION

1. Field of the Invention

The present invention relates to a system and method of testing a reference voltage circuit. More precisely, the present invention relates to a system and method of testing for a reference voltage circuit, which speeds up the suitability test of the switching elements by controlling a judgment reference of the comparator.

2. Description of the Related Art

The existing reference voltage circuit can achieve a power-saving effect while maintaining accuracy of output of the bandgap reference voltage circuit by storing the bandgap reference voltage output by the highly accurate bandgap reference voltage circuit in the capacitor and then turning on or off the bandgap reference voltage circuit to reset the voltage of the capacitor. However, there is a relatively high requirement for accuracy for the current flowing out from the capacitor.

In addition, the leakage current of the switching element corresponding to the capacitor in the off state may be different due to the deviation of the process, and it may cause the aforementioned reference voltage circuit to not operate correctly. Therefore, it is necessary to test for each switching element.

Furthermore, in the above-mentioned reference voltage circuit, the timing of switching the bandgap reference circuit mainly depends on the leakage condition of each capacitor, and thus it often requires a long test time to confirm whether each switch is suitable for the aforementioned reference voltage circuit under the condition that the leakage current of the switching element is very low. The excessive test time leads to excessive manufacturing time and excessive costs.

SUMMARY OF THE INVENTION

In order to solve the above-mentioned problems, the present invention provides a system for testing a reference voltage circuit applicable to a reference voltage circuit. The reference voltage circuit includes a first switch, a second switch, a bandgap reference voltage circuit, a first capacitor, a second capacitor and a comparator. The bandgap reference voltage circuit is connected to one terminal of the first switch and one terminal of the second switch respectively and outputs a bandgap reference voltage. The first capacitor is connected between the other terminal of the first switch and a ground terminal. The second capacitor is connected between the other terminal of the second switch and another ground terminal. The comparator is connected to the first capacitor and the second capacitor respectively to compare the voltage difference between the first capacitor and the second capacitor. The system includes: a control logic unit connected to an output terminal of the comparator and a control terminal of the comparator, and connected to a control terminal of the first switch, a control terminal of the second switch and the bandgap reference voltage circuit. In the first test stage of the control logic unit, the control logic unit adjusts a delayed voltage of the comparator through the control terminal of the comparator, such that a comparison reference of the comparator is reduced to a test voltage from an allowable value; the control logic unit further controls the first switch to turn off, the second switch to turn on and the first capacitor to start discharging; the control logic unit is configured to start timing, the comparator is triggered to output a switching signal when the comparator compares a voltage difference between the first capacitor and the second capacitor and the voltage difference exceeds the test voltage, the control logic unit receives the switching signal and records a first time, and enters a second test stage. In a second test stage of the control logic unit, the control logic unit controls the first switch to turn on, the second switch to turn off, the first capacitor is charged to the bandgap reference voltage, the second capacitor starts discharging, the control logic unit starts timing again; the control logic unit is configured to determine whether the comparator is triggered during a time a time interval between a starting time of the second test stage and a second time or not, if yes, it is determined to fail the test, if no, it is determined to pass the test. The second time is longer than the first time, and the variation rate of the voltage of the first capacitor during charging and discharging is longer than the variation rate of the voltage of the second capacitor during charging and discharging.

Preferably, in the active mode of the control logic unit, the control logic unit controls the first switch and the second switch to turn on, the first capacitor and the second capacitor are charged to the bandgap reference voltage respectively, and the comparator is preset to compare whether the voltage difference between the first capacitor and the second capacitor exceeds the allowable value.

Preferably, the control logic unit further includes a timing unit configured to time in the first test stage and the second test stage respectively for the first time and the second time.

Preferably, the control logic unit further includes a processing unit configured to calculate the second time based the first time, and is further configured to determine whether the comparator is triggered during the time interval between the starting time of the second test stage and the second time.

Preferably, the processing unit is configured to calculate the second time associated with a ratio of the second capacitor and the first capacitor based on the first time.

According to another aspect of the present invention is to provide a testing method of the reference voltage circuit for testing a reference voltage circuit. The reference voltage circuit includes a bandgap reference voltage circuit, a first capacitor, a second capacitor and a comparator. The bandgap reference voltage circuit is connected to one terminal of the first switch and one terminal of the second switch respectively and outputs a bandgap reference voltage. The first capacitor is connected between the other terminal of the first switch and a ground terminal. The second capacitor is connected between the other terminal of the second switch and another ground terminal. The comparator is connected to the first capacitor and the second capacitor respectively to compare a voltage difference between the first capacitor and the second capacitor. The testing method includes the following steps: entering a first test stage, adjusting a delayed voltage of the comparator through the control terminal of the comparator, such that a comparison reference of the comparator is reduced to a test voltage from an allowable value; controlling the first switch to turn off, the second switch to turn on, the first capacitor to start discharging; starting timing, triggering the comparator to output a switching signal and recording a first time at the same time when the comparator compares a voltage difference between the first capacitor and the second capacitor and the voltage difference exceeds the test voltage, and entering a second test stage; controlling the first switch to turn on, the second switch to turn off, the first capacitor to be charged to the bandgap reference voltage, the second capacitor to start discharging, and starting to time again; determining whether the comparator is triggered during a time interval between the starting time of the second test stage and a second time or not, if yes, it is determined to fail the test, if no, it is determined to pass the test, wherein the second time is larger than the first time, and a variation rate of a voltage of the first capacitor during charging and discharging is larger than a variation rate of a voltage of the second capacitor during charging and discharging.

Preferably, the testing method further includes a step of entering an active mode, wherein in the active mode, controlling the first switch and the second switch are turned on, the first capacitor and the second capacitor are charged to the bandgap reference voltage respectively, and the comparator is preset to compare whether or not a voltage difference between the first capacitor and the second capacitor exceeds the allowable value.

Preferably, the testing method further includes configuring a timing unit to time in the first test stage and the second test stage respectively for the first time and the second time.

Preferably, the timing unit includes an oscillator or a clock signal generator.

Preferably, the testing method further includes configuring a processing unit to calculate the second time based the first time, and further configures the processing unit to determine whether the comparator is triggered during the time interval between the starting time of the second test stage and a second time.

Preferably, the testing method further includes configuring the processing unit to calculate the second time associated with a ratio of the second capacitor and the first capacitor based on the first time.

According to another aspect of the present invention is to provide testing method for a reference voltage circuit, wherein the reference voltage circuit is configured to output a reference voltage with a refresh rate, and the refresh rate is determined to a difference between variation rates of voltage of a first capacitor and a second capacitor of the reference voltage circuit during charging and discharging, and the method includes: charging the first capacitor to a first voltage, and then discharging the first capacitor and counting a first time taken for a difference between voltage of the first capacitor and the first voltage to reach a reference voltage; charging the second capacitor to the first voltage, and then discharging the second capacitor and counting a second time taken for a difference between voltage of the second capacitor and the first voltage to reach the reference voltage; determining, according to a relation between the first time and the second time, whether the reference voltage circuit passes the test.

Preferably, the testing method further includes configuring a comparator connected to the first capacitor and the second capacitor respectively to compare a voltage difference between the first capacitor and the second capacitor.

Preferably, the testing method further includes the first capacitor and the second capacitor reach to the reference voltage respectively.

Preferably, the testing method further includes configuring a timing unit to time in a first test stage and a second test stage respectively for the first time and the second time.

Preferably, the testing method further includes configuring a processing unit to calculate the second time based the first time.

In summary, the system and method for testing reference voltage circuit of the present invention can confirm whether each switching element is suitable for the reference voltage circuit in an extremely short test time when the delayed voltage of the comparator is adjusted such that the allowable value thereof is significantly decreased, thereby significantly decreasing the required time cost.

Furthermore, the test scheme can adjust its testing reference in accordance with the user's needs and thus the applicability of the switching elements can be confirmed quickly even if the configuration of the reference voltage circuit is different.

BRIEF DESCRIPTION OF THE DRAWINGS

The aforementioned and other features and advantages of the present invention will become apparent according to the exemplary embodiments described in more detail with reference to the accompanying drawings in which:

FIG. 2C is a voltage timing diagram illustrating of a system for testing reference voltage circuit in an active mode and a power saving mode according to an embodiment of the present invention.

DETAILED DESCRIPTION OF THE PREFERRED EMBODIMENTS

For a better understanding of the features, contents and advantages of the present invention, and the effect that may be achieved therefrom, the present embodiments of the present invention are described in more detail as follows with reference to the accompanying drawings. It should be noted that the drawings and exemplary embodiments herein are used for the purpose of illustrating and assisting the specification, without necessarily implying the actual ratio and the precise configuration. Therefore, in the accompanying drawings, the ratio and the configuration shall not be interpreted in any way that limits the scope of the present invention.

Figure 1:
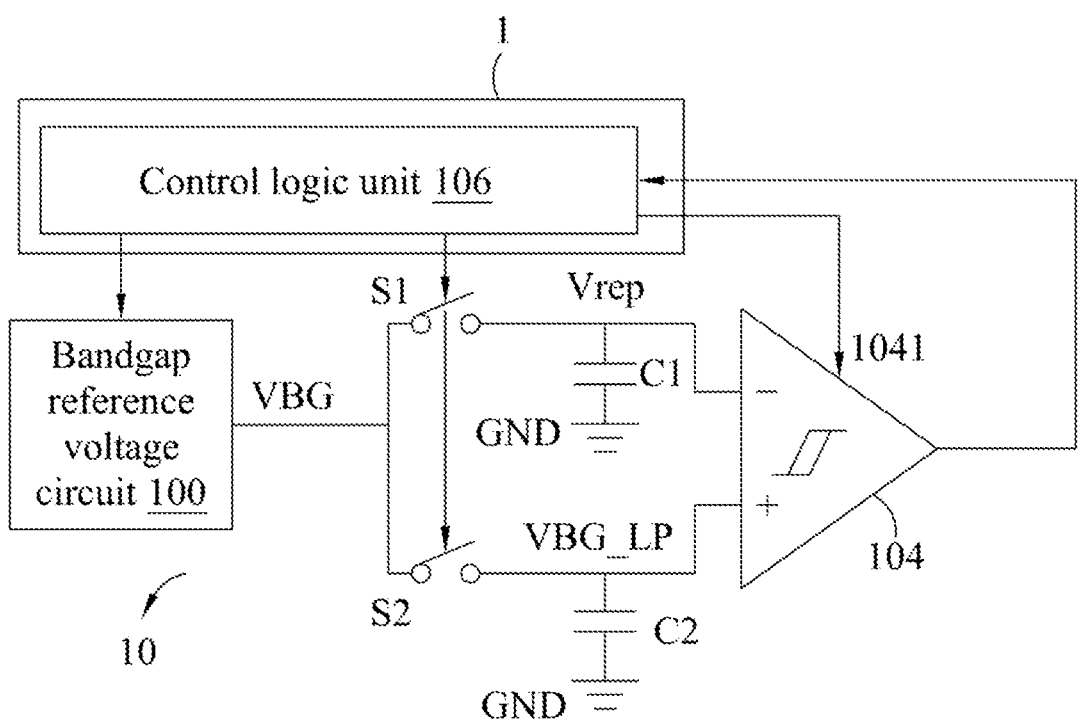
FIG. 1 is a block diagram illustrating a system for testing reference voltage circuit according to an embodiment of the present invention.

Please refer to FIG. 1, which is a block diagram illustrating a system for testing reference voltage circuit according to an embodiment of the present invention. As shown in FIG. 1, a system 1 for testing reference voltage circuit is applied to a reference voltage circuit 10. The reference voltage circuit 10 includes a bandgap reference voltage circuit 100, a first capacitor C1, a second capacitor C2, and a comparator 104. The testing system 1 includes a control logic unit 106. The bandgap reference voltage circuit 100 is electrically connected to a terminal of a first switch S1, a terminal of a second switch S2, and outputs a bandgap reference voltage VBG. A first terminal of the first capacitor C1 is electrically connected to the other terminal of first switch S1 and a second terminal of the first capacitor C1 is electrically connected to a ground terminal GND. A first terminal of the second capacitor C2 is electrically connected to the other terminal of second switch S2 and a second terminal of the second capacitor C2 is connected to another ground terminal GND. Optionally, the capacitance value of the second capacitor C2 is larger than the capacitance value of the first capacitor C1.

The comparator 104 is electrically connected to the first terminal of the first capacitor C1 and the first terminal of the second capacitor C2 respectively to compare a voltage difference between the first terminal of the first capacitor C1 and the first terminal of the second capacitor C2. The control logic unit 106 is electrically connected to an output terminal of the comparator 104, a control terminal of the first switch S1, a control terminal of the second switch S2, and the bandgap reference voltage circuit 100. Also, the control logic unit 106 is further electrically connected to a control terminal 1041 of the comparator 104. The aforementioned control logic unit 106 is also connected to the bandgap reference voltage circuit 100.

Figure 2A:
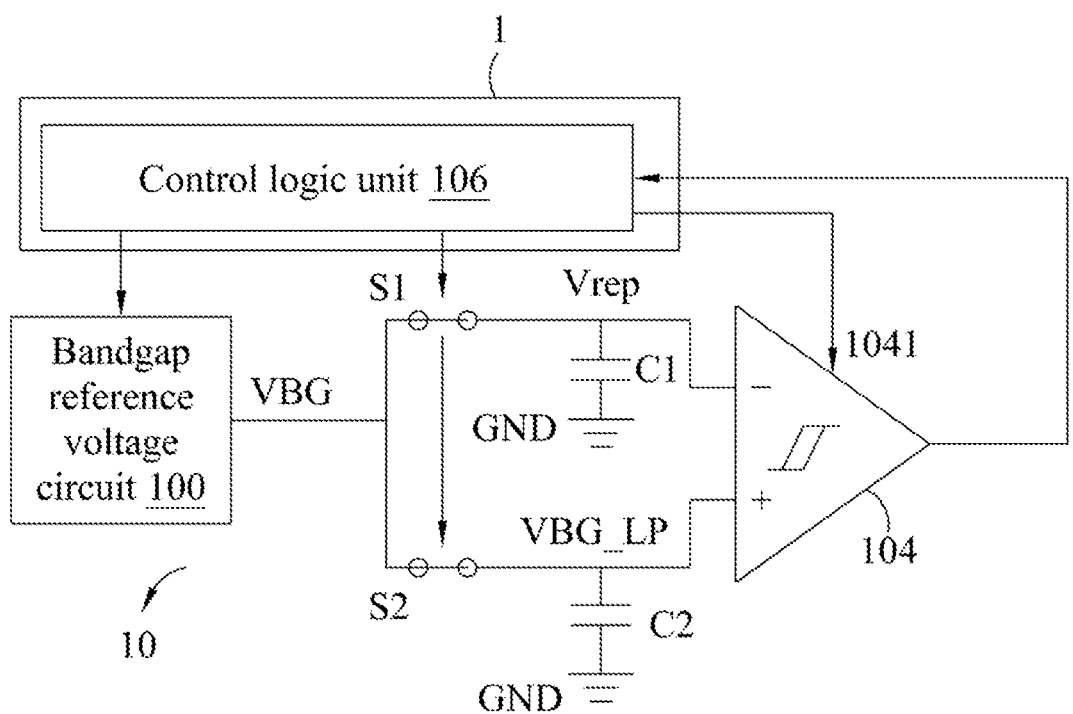
FIG. 2A and FIG. 2B are circuit layout diagrams illustrating a system for testing reference voltage circuit in an active mode and a power saving mode according to an embodiment of the present invention.
Figure 2B:
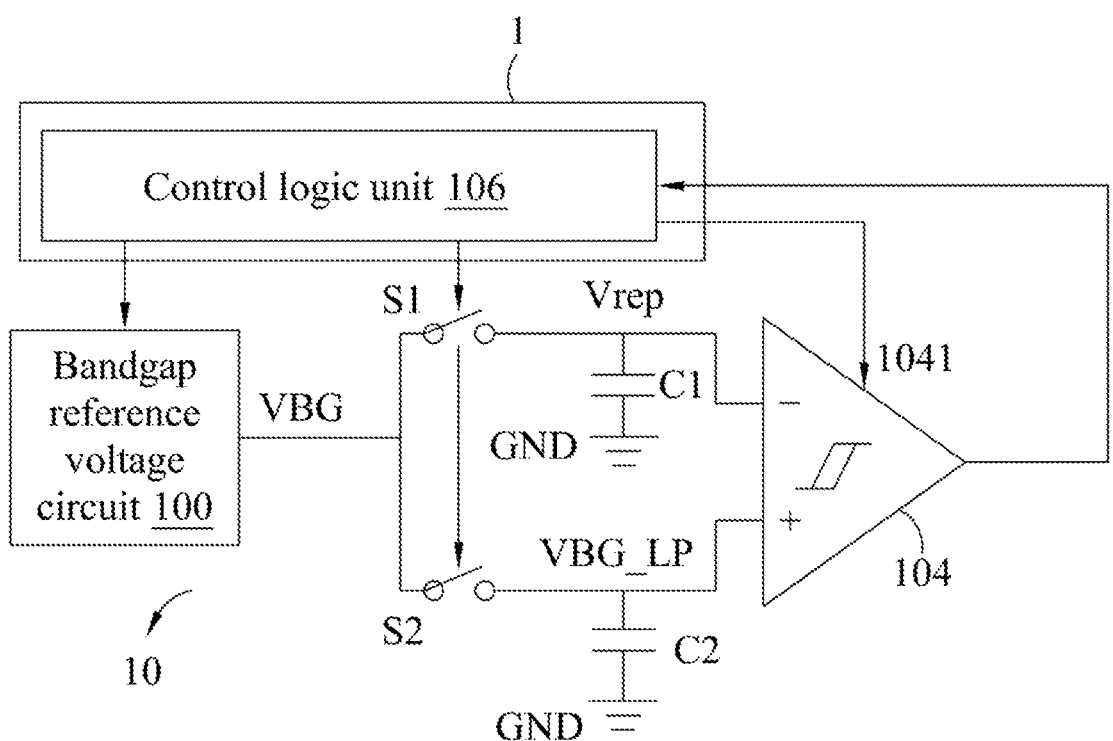

The operational flow of the system for testing a reference voltage circuit of the present invention in an active mode and a power saving mode is described with reference to the accompanying drawings as follows. Please refer to FIGS. 2A to 2C. FIGS. 2A and 2B are circuit layout diagrams illustrating a system for testing reference voltage circuit in an active mode and a power saving mode according to a second embodiment of the present invention, and FIG. 2C is a voltage timing diagram illustrating of a system for testing reference voltage circuit in an active mode and a power saving mode according to an embodiment of the present invention. The working mode of the control logic unit 106 of the present invention includes an active mode and a power saving mode. Please refer to FIG. 2A, after activating the system, the control logic unit 106 is initially in an active mode, the control logic unit 106 controls the bandgap reference voltage circuit 100 to output a bandgap reference voltage VBG, and controls the first switch S1 and the second switch S2 to turn on.

At this time, a voltage level Vrep of the first terminal of the first capacitor C1 and a voltage level VBG_LP of the first terminal of the second capacitor C2 may be charged to the bandgap reference voltage VBG, when the voltages of the first terminals of the first capacitor C1 and the second capacitor C2 reach to the bandgap reference voltage VBG, the voltage difference between them is 0, so that the comparator 104 outputs a first comparison signal to the control logic unit 106, and the comparator 104 is then to enter a power saving mode. At this time, the voltage level VBG_LP of the first terminal of the second capacitor C2 may be used for a power management circuit as a reference voltage.

Please refer to FIG. 2B. In the power saving mode, the control logic unit 106 controls the first switch S1 and the second switch S2 to turn off, and controls the bandgap reference voltage circuit 100 to stop outputting the bandgap reference voltage VBG. At this time, the voltage levels of the first terminals of the first capacitor C1 and the second capacitor C2 are ideally maintained at the bandgap reference voltage VBG, however, the first switch S1 and the second switch S2 are usually PMOSFETs that are not the ideal components because of small leakage currents which are still generated even in the off state. Therefore, in the power saving mode, the first capacitor C1 and the second capacitor C2 may discharge to the left first switch S1 and second switch S2 respectively, and thus reduction of the charge in the first capacitor C1 and the second capacitor C2 may cause voltage offsets of the voltage level Vrep and the voltage level VBG_LP from the bandgap reference voltage VBG output from the bandgap reference voltage circuit 100.

In the above architecture, the capacitance value of the first capacitor C1 and the capacitance value of the second capacitor C2 may be designed to enable the control logic unit 106 to output a control signal corresponding to the difference between in the voltage level Vrep and the voltage level VBG_LP. The above capacitance value of the first capacitor C1 is larger than the capacitance value of the second capacitor C2, the variation of the capacitance value may be represented by:

$$\Delta C = Q/\Delta V = I_{DISCHARGE} * T_{DISCHARGE}/\Delta V \quad (1)$$

When the voltage difference between the first terminals of the first capacitor C1 and the second capacitor C2 is larger than a predetermined value, the comparator 104 outputs a second comparison signal, the control logic unit 106 returns to the active mode according to the second comparison signal, as shown in FIG. 2A.

More specifically, as shown in FIG. 2C, the system enters the active mode at the time T01 shown in FIG. 2C; the reference voltage circuit is in the active mode, and the bandgap reference voltage circuit 100 is turned on and outputs the bandgap reference voltage VBG. At this time, the capacitance value of the first capacitor C1 is 1 pF, the capacitance value of the second capacitor C2 is 10 pF, the voltage level Vrep of the first terminal of the first capacitor C1 and the voltage level VBG_LP of the second terminal of the second capacitor C2 are charged to the bandgap reference voltages VBG by the bandgap reference voltage VBG.

When the comparator 104 compares a voltage level difference between the voltage level Vrep of the first terminal of the first capacitor C1 and the voltage level VBG_LP of the second terminal of the second capacitor C2 and wherein the voltage level difference is 0, outputting a comparison signal and entering the power saving mode, turning off the bandgap reference voltage circuit 100, stopping output of the bandgap reference voltage VBG.

At this time, as the time T02 shown in FIG. 2C, the first switch S1 and the second switch S2 are turned off, the first capacitor C1 and the second capacitor C2 start discharging. Therefore, the voltage level Vrep of the first terminal of the first capacitor C1 and the voltage level VBG_LP of the second terminal of the second capacitor C2 all decrease. However, the leakage currents are different, and thus it is assumed that though the leakage currents are same, the voltage level VBG_LP decreases slower than the voltage level Vrep. When a difference $\Delta V$ between the voltage level VBG_LP and the voltage level Vrep reaches the allowable value of the comparator (that is a delayed voltage VHYS), the difference between the voltage level VBG_LP and the voltage level Vrep and the difference exceeds the allowable value through comparison of the comparator 104 while entering a time T03, the level of the compared voltage COMP_OUT increases, outputting a second comparison signal, the control logic unit 106 controls the bandgap reference voltage circuit 100 to turn on and enter the active mode to continually output the bandgap reference voltage VBG to reset the voltage levels Vrep and VBG_LP of the first capacitor C1 and the second capacitor C2 when receiving the second comparison signal. The bandgap reference voltage circuit 100 is turned off and enters the power saving mode again when it is detected that the difference ΔV between the voltage level VBG_LP and the voltage level Vrep is 0 by the comparator 104.

However, the formula (1) shows that the variations of the voltage level Vrep and the voltage level VBG_LP depend on the current leakage condition of the first switch S1 and the second switch S2, the leakage currents of the first switch S1 and the second switch S2 may be different in the off state and thus it may cause the aforementioned reference voltage circuit to not operate correctly and each switching element needs to be tested.

In the conventional test manner, initially, the first switch S1 is turned on and the second switch S2 is turned off. When the first capacitor C1 discharges such that the difference between the voltage level Vrep and the voltage level VBG_LP exceeds the allowable value, the required time is recorded as the first time T1, and then the first switch S1 is turned off and the second switch S2 is turned on. When the second capacitor C2 discharges such that the difference between the voltage level Vrep and the voltage level VBG_LP exceeds the allowable value, the required time is recorded as the second time T2. The reference voltage circuit may be made sure to smoothly operate as long as the second time T1 is more than N times larger than the first time T1, for example, the ratio of the capacitance value of the first capacitor C1 and the capacitance value of the second capacitor C2 is C2/C1, such as C2/C1=10 that is the second time T2 is more than 10 times larger than the first time T1. However, in the above-mentioned architecture of the low power consumption, since the leakage current is extremely small, it may take an extremely long time to confirm that the leakage conditions of the first switch S1 and the second switch S2 are in accordance with expectations. As a result, the excessive test time leads to excessive time costs.

Figure 3A:
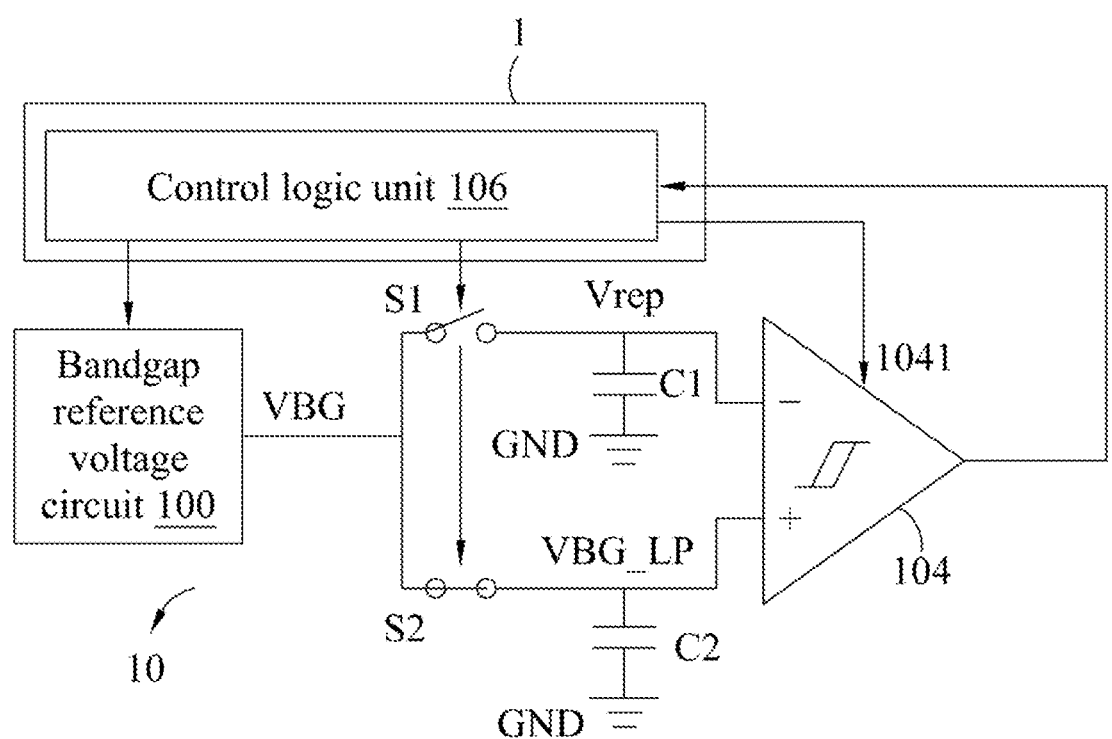
FIG. 3A and FIG. 3B are circuit layout diagrams illustrating a system for testing reference voltage circuit in a test mode according to an embodiment of the present invention.
Figure 3B:
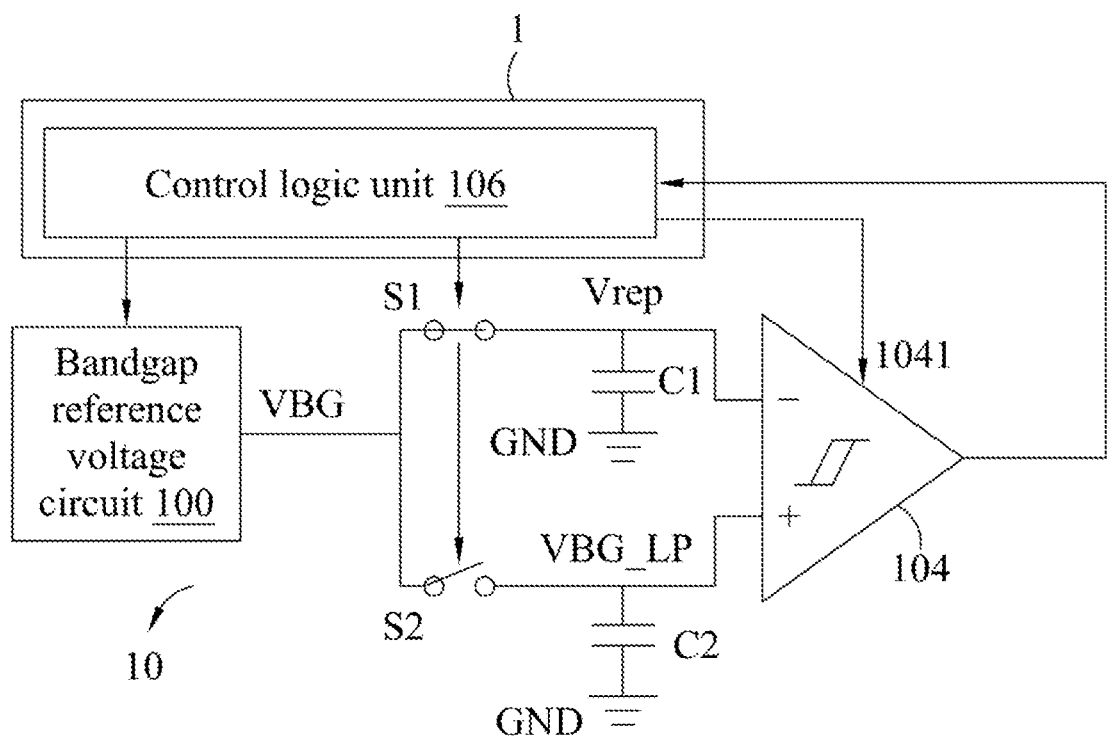
Figure 3C:
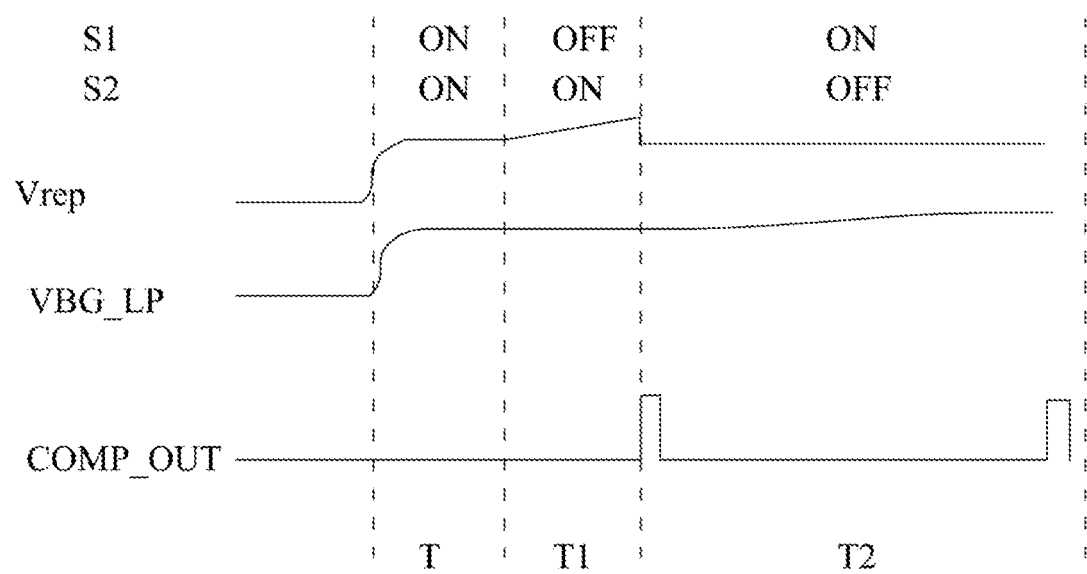
FIG. 3C is a voltage timing diagram illustrating a system for testing reference voltage circuit in a test mode according to an embodiment of the present invention.

Therefore, to provide a solution for the aforementioned problem, the present invention provides a system for testing a reference voltage circuit, which is described with reference to FIGS. 3A-3C as follows. FIGS. 3A and 3B are circuit layout diagrams illustrating a system for testing reference voltage circuit in a test mode according to an embodiment of the present invention, FIG. 3C is a voltage timing diagram illustrating a system for testing reference voltage circuit in a test mode according to an embodiment of the present invention.

The circuit configuration must initially start in the active mode of FIG. 2A before entering the test mode, the control logic unit 106 controls the bandgap reference voltage circuit 100 to output the bandgap reference voltage VBG and controls the first switch S1 and the second switch S2 to turn on, such that the voltage level Vrep of the first terminal of the first capacitor C1 and the voltage level VBG_LP of the first terminal of the second capacitor C2 are charged to the bandgap reference voltage VBG, and enters the test mode when the voltages of the first terminals of the first capacitor C1 and the second capacitor C2 reach the bandgap reference voltage VBG.

The test mode includes a first test stage and a second test stage. As shown in FIG. 3A, in the first test stage of the control logic unit 106, the control logic unit 106 adjusts the delayed voltage of the comparator 104 through the control terminal 1041 of the comparator 104 such that the comparison reference of the comparator 104 is reduced to a test voltage from the original allowable value. Further, the control logic unit 106 controls the first switch S1 to turn off and the second switch S2 to turn on, and if the first switch S1 is a non-ideal switching element at this time, leakage thereof causes the first capacitor C1 to start discharging. The control logic unit 106 includes a built-in timing unit for timing, which may be an oscillator, an internal clock signal generator, or timing based on an external clock signal. The first capacitor C1 discharges and the control logic unit 106 is configured to start timing at the same time, the comparator 104 is triggered to output a switching signal when the voltage difference between the voltage level Vrep and voltage level VBG_LP exceeds the test voltage through comparison of the comparator 104, the control logic unit 106 receives the switching signal and records the required time as the first time T1 while entering the second test stage.

In the second test stage of the control logic unit 106, the control logic unit controls the first switch S1 to turn on and the second switch S2 to turn off. Therefore, the first capacitor C1 recharges to the bandgap reference voltage VBG and the second capacitor C2 starts discharging. At this time, the control logic unit 106 is configured to start timing again.

The control logic unit 106 includes a built-in processing unit for setting the second time T2 based on the recorded first time T1 due to it only needs to determine whether an occurrence rate of the leakage conditions of the first switch S1 and the second switch S2 is higher than a certain percentage in the test. More specifically, the second time T2 is set as N times of the first time T1, N corresponds the ratio of the capacitance value of the first capacitor C1 and the capacitance value of the second capacitor C2, such as C2/C1=10 that is the second time T2 is set as more than 10 times larger than the first time T1, the reference voltage circuit is made sure to smoothly operate as long as the comparator 104 is untriggered after the second time T2.

Therefore, the control logic unit 106 or the processing unit thereof may be configured to determine whether the comparator 104 is triggered during the time interval between the starting time of the second test stage and the second time T2, if yes, the current leakage conditions of the first switch S1 and the second switch S2 may result in the reference voltage circuit operating abnormally and it is determined to fail the test. If the comparator 104 is not triggered during a time interval between the starting time of the second test stage and a second time T2, it is determined to pass the test, it means that the current leakage conditions of the first switch S1 and the second switch S2 are compliant with the requirements of the reference voltage circuit.

More specifically, as shown in FIG. 3C, the system enters the active mode as the T stage shown in FIG. 3C, the reference voltage circuit is in the active mode, the bandgap reference voltage circuit is turned on and outputs the bandgap reference voltage VBG. At this time, the capacitance value of the first capacitor C1 is 1 pF, the capacitance value of the second capacitor C2 is 10 pF, the voltage level Vrep of the first terminal of the first capacitor C1 and the voltage level VBG_LP of the second terminal of the second capacitor C2 are charged to the bandgap reference voltage VBG by the bandgap reference voltage VBG.

Then, entering the first stage of the test mode, the control logic unit 106 adjusts the delayed voltage VHYS of the comparator 104 such that the allowable value is reduced to a test voltage, and turns off the first switch S1 and maintains the second switch S2 in the on condition, the control logic unit 106 starts timing, the comparator 104 is triggered to output the switching signal when the comparator 104 compares the voltage difference between the voltage level Vrep and the voltage level VBG_LP exceeds the test voltage, the control logic unit 106 receives the switching signal and records the required time as the first time T1 while entering the second test stage.

In second stage, the control logic unit 106 controls the first switch S1 to turn on, the second switch S2 to turn off, and the control logic unit 106 is further configured to determine whether or not the comparator 104 is triggered during the time interval between the starting time of the second test stage and the second time T2. As shown in FIG. 3C, the comparator 104 is triggered before exceeding the second time T2 and thus it is determined not to pass the test, the current leakage conditions of the first switch S1 and the second switch S2 may result in the reference voltage circuit operating abnormally.

Therefore, it is possible to confirm whether each switching element is suitable for the reference voltage circuit in a very short test time under a condition that the delayed voltage of the comparator 104 is adjusted to substantially reduce its allowable value. This significant reduction in test time can save significant costs related to time.

Figure 4:
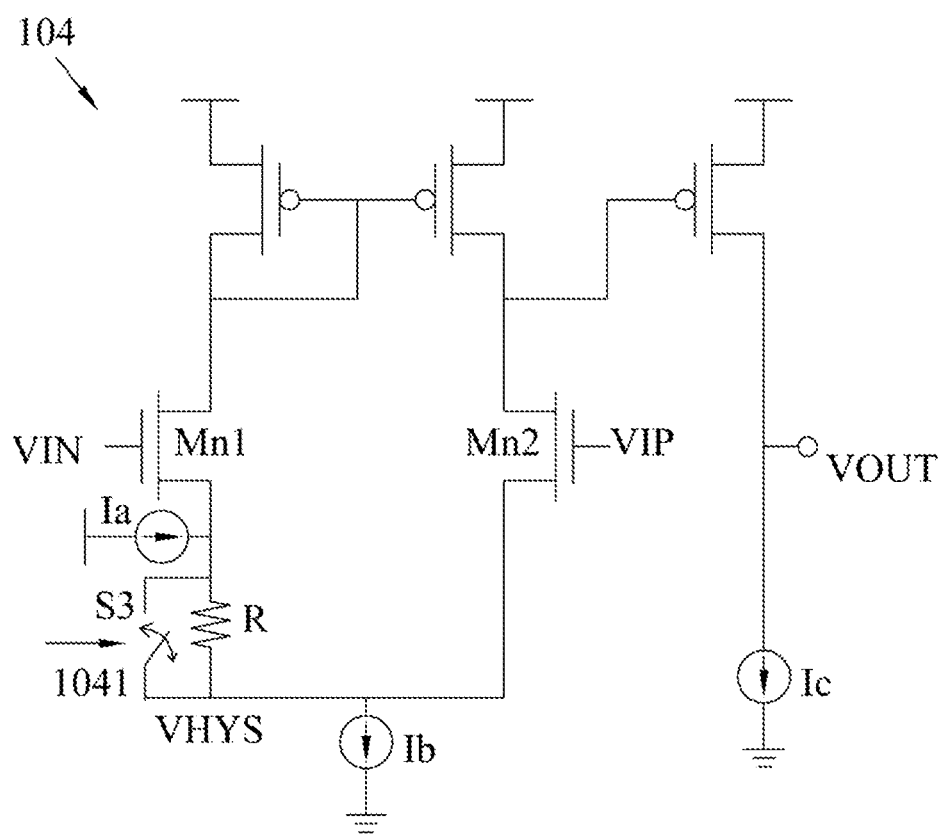
FIG. 4 is a circuit layout diagram illustrating a comparator according to an embodiment of the present invention.

Please refer to FIG. 4, which is a circuit layout diagram illustrating a comparator according to an embodiment of the present invention. As shown in FIG. 4, the circuit of the comparator 104 has low power consumption and precise delaying characteristics. As the architecture shown in FIG. 4, Ia, Ib, Ic are bias currents generated by the bias circuit generator 102, R is a delayed resistor, and preferably may be connected in parallel with the third switch S3 corresponding to the control terminal 1041 of the comparator 104. The first input terminal VIN is used as an input of the transistor Mn1 and the second input terminal VIP is used as an input of the transistor Mn2 in the comparator 104. The delayed resistor R is related to the current of the bias circuit generator 102, and thus the delayed voltage of the comparator 104 is VHYS=R*(Ia+0.5Ib). Therefore, the delayed voltage VHYS may be changed by changing the delayed resistor R, so the delay resistor R may decrease after the control logic unit 106 controls the third switch S3 to turn on such that the delayed voltage VHYS is reduced. The reduced delayed voltage VHYS may be a test voltage lower than the predetermined allowable value in the aforementioned test mode, the design of the delayed voltage VHYS can be calculated using the following equation:

$$Q=C*V, \Delta Q=C*\Delta V, \Delta Q2=C2*\Delta VBG,$$
$$\Delta Q1=C1*\Delta Vrep,$$

$$C2*\Delta VBG=C1*\Delta Vrep, \Delta VBG=x, \Delta Vrep=y,$$

$$C2*x=C1*y, y=x*C2/C1,$$

$$x-y=x-x*C2/C1=x*(1-C2/C1),$$

$$VHYS=x*(1-C2/C1).$$

Wherein C2=10*C1, the bandgap reference voltage VBG is a desired reference voltage to be output, Vrep is a reference voltage of the first capacitor C1, x is an allowable variable range of ΔVBG. The values of the delayed voltage VHYS to be designed can be obtained based on the above x, C1 and C2. Therefore, the control logic unit 106 is configured to adjust the delayed voltage VHYS through the control terminal 1041 of the comparator 104 so as to significantly reduce the allowable value, thereby decreasing the time required for testing the first switch S1 and the second switch S2.

It can be understood that the reference voltage circuit 10 further includes a bias circuit generator connected to the bandgap reference voltage circuit 100, which is connected to a power supply terminal of the comparator 104 although they are not illustrated in the accompanying drawings. The bias circuit generator may be a constant-gm circuit for providing a bias current to the comparator 104 and the bandgap reference voltage circuit 100. Preferably, the bias circuit generator includes a plurality of output terminals through which a plurality of different constant currents are provided, for example, the bias circuit generator may provide a constant current of 10 nA/25 nA/50 nA/75 nA.

Figure 5:
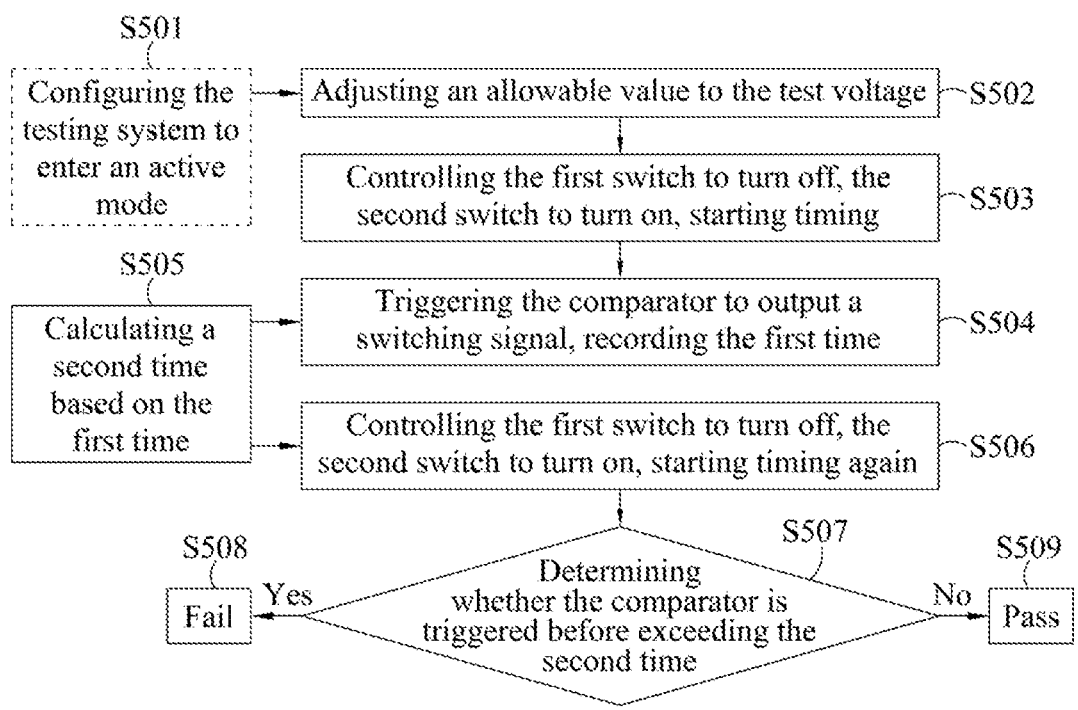
FIG. 5 is a flowchart illustrating a method for testing reference voltage circuit according to an embodiment of the present invention.

The method for testing reference voltage circuit of the present invention is described with reference to the accompanying drawings as follows. Please refer to FIG. 5, which is a flowchart illustrating a method for testing reference voltage circuit according to an embodiment of the present invention. As shown in FIG. 5, optionally, the test system is initially preset in the active mode (step S501). As shown in FIG. 3A, the bandgap reference voltage circuit 100 is turned on and outputs the bandgap reference voltage VBG. The reference voltage circuit is in the active mode, the bandgap reference voltage circuit 100 is turned on and outputs the bandgap reference voltage VBG. At this time, the voltage level Vrep of the first terminal of the first capacitor C1 and the voltage level VBG_LP of the second terminal of the second capacitor C2 are charged to the bandgap reference voltage VBG by the bandgap reference voltage VBG.

Then, entering the first stage of the test mode, adjusting the delayed voltage VHYS of the comparator 104 (it may be performed by configuring the control logic unit 106) to reduce the allowable value to the test voltage (step S502), and turning off the first switch S1, maintaining the second switch S2 in an open state, starting to time (step S503) by the control logic unit 106, the comparator 104 is triggered to output the switching signal when the compared voltage difference between the voltage level Vrep and the voltage level VBG_LP exceeds the test voltage, the control logic unit 106 receives the switching signal, and records the required time as the first time T1 (step S504) while entering the second test stage.

In the second stage, the control logic unit 106 calculates the second time T2 based on the initially recorded first time T1 (step S505). In detail, the control logic unit 106 may be further configured with a built-in processing unit for setting the second time T2 based on the recorded first time T1 as a reference. The second time T2 is set as N times of the first time T1, N may preferably correspond to the ratio of the capacitance value of the first capacitor C1 and the capacitance value of the second capacitor C2, for example, C2/C1=10 that is the second time T2 is set more than 10 times larger than the first time T1.

Then, the control logic unit 106 controls the first switch S1 to turn on, the second switch S2 to turn off, and starts to time (step S506). The control logic unit 106 is then configured to determine whether or not the comparator 104 is triggered during the time interval between the starting time of the second test stage and a second time T2 (step S507). If yes, it means that the current leakage conditions of the first switch S1 and the second switch S2 may result in the reference voltage circuit operating abnormally and it is determined to fail the test (step S508). If the comparator 104 is not triggered during a time interval between the starting time of the second test stage and a second time T2, it is determined to pass the test (step S509), it means that the current leakage conditions of the first switch S1 and the second switch S2 are compliant with the requirements of the reference voltage circuit.

It should be noted that the above steps may be performed by a processor or a microcontroller in a manner implemented by a hardware, a firmware or a software, and all calculation and determination procedures carried out by the control logic unit may be stored in the nonvolatile memory in the form of program code, and the computer system may also provide assistance in the implementation rather than being limited to the above-mentioned embodiments.

In summary, the system and method for testing reference voltage circuit of the present invention can significantly decrease the time required for testing the switching elements by adjusting the comparison reference of the comparator in the test mode. The test scheme can adjust its testing reference in accordance with the user's needs, and therefore, the applicability of the switching elements can be confirmed fast in the reference voltage circuit having high precision and low power consumption features.

The above-described embodiments are merely an exemplary illustration, and the present invention is not limited thereto. Any equivalent modification or change may be made thereto without departing from the scope and the spirit of the present invention and is covered by the appended claims.

What is claimed is:

1. A system for testing a reference voltage circuit, wherein the reference voltage circuit comprises a first switch, a second switch, a bandgap reference voltage circuit, a first capacitor, a second capacitor and a comparator; the bandgap reference voltage circuit is connected to one terminal of the first switch and one terminal of the second switch respectively and outputs a bandgap reference voltage; the first capacitor is connected between the other terminal of the first switch and a ground terminal; the second capacitor is connected between the other terminal of the second switch and another ground terminal; and the comparator is connected to the first capacitor and the second capacitor respectively to compare a voltage difference between the first capacitor and the second capacitor, wherein the system comprises:

a control logic unit connected to an output terminal of the comparator and a control terminal of the comparator, and connected to a control terminal of the first switch, a control terminal of the second switch and the bandgap reference voltage circuit;

wherein in a first test stage of the control logic unit, the control logic unit adjusts a delayed voltage of the comparator through the control terminal of the comparator, such that a comparison reference of the comparator is reduced to a test voltage from an allowable value; the control logic unit further controls the first switch to turn off, the second switch to turn on and the first capacitor to start discharging; the control logic unit is configured to start timing, the comparator is triggered to output a switching signal when the comparator compares a voltage difference between the first capacitor and the second capacitor and the voltage difference exceeds the test voltage, the control logic unit receives the switching signal and records a first time, and enters a second test stage, wherein in a second test stage of the control logic unit, the control logic unit controls the first switch to turn on, the second switch to turn off, the first capacitor is charged to the bandgap reference voltage, the second capacitor starts discharging, the control logic unit starts timing again; the control logic unit is configured to determine whether the comparator is triggered during a time interval between a starting time of the second test stage and a second time or not, if yes, it is determined to fail the test, if no, it is determined to pass the test, and wherein the second time is larger than the first time, and a variation rate of a voltage of the first capacitor during charging and discharging is longer than a variation rate of a voltage of the second capacitor during charging and discharging.

2. The system of claim 1, wherein in an active mode of the control logic unit, the control logic unit controls the first switch and the second switch to turn on, the first capacitor and the second capacitor are charged to the bandgap reference voltage respectively, and the comparator is preset to compare whether or not the voltage difference between the first capacitor and the second capacitor exceeds the allowable value.

3. The system of claim 1, wherein the control logic unit further comprises a timing unit configured to time in the first test stage and the second test stage respectively for the first time and the second time.

4. The system of claim 1, wherein the control logic unit further comprises a processing unit configured to calculate the second time based the first time, and is further configured to determine whether or not the comparator is triggered during the time interval between the starting time of the second test stage and the second time.

5. The system of claim 4, wherein the processing unit is configured to calculate the second time associated with a ratio of the second capacitor and the first capacitor based on the first time.

6. A testing method of a reference voltage circuit for testing a reference voltage circuit, wherein the reference voltage circuit comprises:

a bandgap reference voltage circuit connected to one terminal of the first switch and one terminal of the second switch respectively and outputting a bandgap reference voltage;

a first capacitor connected between the other terminal of the first switch and a ground terminal;

a second capacitor connected between the other terminal of the second switch and another ground terminal;

a comparator connected to the first capacitor and the second capacitor respectively to compare a voltage difference between the first capacitor and the second capacitor, wherein the testing method comprises the following steps:

entering a first test stage, adjusting a delayed voltage of the comparator through the control terminal of the comparator; such that a comparison reference of the comparator is reduce to a test voltage from an allowable value;

controlling the first switch to turn off, the second switch to turn on, the first capacitor to start discharging;

starting timing, triggering the comparator to output a switching signal and recording a first time at the same time when the comparator compares a voltage difference between the first capacitor and the second capacitor and the voltage difference exceeds the test voltage, and enters a second test stage;

controlling the first switch to turn on, the second switch to turn off, the first capacitor to be charged to the bandgap reference voltage, the second capacitor to start discharging, and starting to time again;

determining whether the comparator is triggered during a time interval between a starting time of the second test stage and a second time or not, if yes, it is determined not to pass the test, if no, it is determined to pass the test, wherein the second time is larger than the first time, and a variation rate of a voltage of the first capacitor during charging and discharging is larger than a variation rate of a voltage of the second capacitor during charging and discharging.

7. The testing method of claim 6, further comprising a step of entering an active mode, wherein in the active mode, controlling the first switch and the second switch to turn on, the first capacitor and the second capacitor are charged to the bandgap reference voltage respectively, and the comparator is preset to compare whether or not the voltage difference between the first capacitor and the second capacitor exceeds the allowable value.

8. The testing method of claim 6, further comprising configuring a timing unit to time in the first test stage and the second test stage respectively for the first time and the second time.

9. The testing method of claim 6, further comprising configuring a processing unit to calculate the second time based the first time, and further configuring the processing unit to determine whether or not the comparator is triggered during the time interval between the starting time of the second test stage and a second time.

10. The testing method of claim 9, further comprising configuring the processing unit to calculate the second time associated with a ratio of the second capacitor and the first capacitor based on the first time.

11. A testing method for a reference voltage circuit, wherein the reference voltage circuit is configured to output a reference voltage with a refresh rate, and the refresh rate is determined to a difference between variation rates of voltage of a first capacitor and a second capacitor of the reference voltage circuit during charging and discharging, and the testing method comprises:

charging the first capacitor to a first voltage, and then discharging the first capacitor and counting a first time taken for a difference between a voltage of the first capacitor and the first voltage to reach the reference voltage;

charging the second capacitor to the first voltage, and then discharging the second capacitor and counting a second time taken for a difference between a voltage of the second capacitor and the first voltage to reach the reference voltage;

determining, according to a relation between the first time and the second time, whether the reference voltage circuit passes the test.

12. The testing method of claim 11, further comprising configuring a comparator connected to the first capacitor and the second capacitor respectively to compare a voltage difference between the first capacitor and the second capacitor.

13. The testing method of claim 11, further comprising the first capacitor and the second capacitor reach to the reference voltage respectively.

14. The testing method of claim 11, further comprising configuring a timing unit to time in a first test stage and a second test stage respectively for the first time and the second time.

15. The testing method of claim 14, further comprising configuring a processing unit to calculate the second time based the first time.

* * * * *